United States Patent
Lin et al.

(10) Patent No.: US 8,557,688 B2
(45) Date of Patent: Oct. 15, 2013

(54) METHOD FOR FABRICATING P-TYPE POLYCRYSTALLINE SILICON-GERMANIUM STRUCTURE

(71) Applicant: National Yunlin University of Science and Technology, Douliu (TW)

(72) Inventors: Jian-Yang Lin, Douliu (TW); Pai-Yu Chang, Douliu (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 13/631,211

(22) Filed: Sep. 28, 2012

(65) Prior Publication Data

US 2013/0034950 A1  Feb. 7, 2013

Related U.S. Application Data

(63) Continuation-in-part of application No. 12/632,311, filed on Dec. 7, 2009, now abandoned.

(51) Int. Cl.
*H01L 21/20* (2006.01)
(52) U.S. Cl.
USPC .................................. 438/488; 257/E21.129
(58) Field of Classification Search
None
See application file for complete search history.

(56) References Cited

U.S. PATENT DOCUMENTS

| | | | |
|---|---|---|---|
| 5,726,065 A | 3/1998 | Szlufcik et al. | |
| 6,764,953 B2 * | 7/2004 | Van Den Broek et al. | 438/688 |
| 2005/0012096 A1 * | 1/2005 | Yamazaki et al. | 257/57 |
| 2006/0151808 A1 * | 7/2006 | Chen et al. | 257/188 |
| 2006/0252235 A1 * | 11/2006 | Aberle et al. | 438/478 |
| 2006/0255340 A1 | 11/2006 | Manivannan et al. | |
| 2007/0032049 A1 * | 2/2007 | Yamazaki et al. | 438/486 |
| 2009/0253225 A1 | 10/2009 | Dubois et al. | |
| 2011/0223747 A1 * | 9/2011 | Scholz et al. | 438/482 |

FOREIGN PATENT DOCUMENTS

WO   WO 2008/098407   8/2008

* cited by examiner

*Primary Examiner* — Seahvosh Nikmanesh
(74) *Attorney, Agent, or Firm* — Muncy, Geissler, Olds & Lowe, PLLC

(57) ABSTRACT

A method for fabricating a P-type polycrystalline silicon-germanium structure comprises steps: forming an aluminum layer and an amorphous germanium layer on a P-type monocrystalline silicon substrate in sequence; annealing the P-type monocrystalline silicon substrate, the aluminum layer and the amorphous germanium layer at a temperature of 400-650° C.; and undertaking an aluminum-induced crystallization process in which germanium atoms of the amorphous germanium layer and silicon atoms of the P-type monocrystalline silicon substrate simultaneously pass through the aluminum layer and then the amorphous germanium layer being induced and converted into a P-type polycrystalline silicon-germanium layer between the P-type monocrystalline silicon substrate and the aluminum layer. The present invention is a simple, reliable and low-cost method to fabricate a P-type polycrystalline silicon-germanium layer on a P-type monocrystalline silicon substrate. In addition, the obtained P-type polycrystalline silicon-germanium layer can convert sunlight of longer wavelengths into electric energy.

7 Claims, 5 Drawing Sheets

METHOD FOR FABRICATING P-TYPE POLYCRYSTALLINE SILICON-GERMANIUM STRUCTURE

CROSS REFERENCE TO RELATED APPLICATIONS

This application is a Continuation-in-Part of co-pending application Ser. No. 12/632,311, filed on Dec. 7, 2009, for which priority is claimed under 35 U.S.C. §120, the entire contents of which are hereby incorporated by reference.

FIELD OF THE INVENTION

The present invention relates to a semiconductor technology, particularly to a method for fabricating a P-type polycrystalline silicon-germanium structure.

BACKGROUND OF THE INVENTION

Solar cells convert light energy into electric energy. A solar cell has a PN junction between the P-type semiconductor and the N-type semiconductor. While illuminated by sunlight, the PN junction generates a great amount of free electrons and electron holes. The negatively-charged electrons move to the surface of the N-type semiconductor, and the positively-charged electron holes move to the surface of the P-type semiconductor. Thereby, an electric potential drop appears between the P-type and N-type semiconductors, providing electric energy for the user.

Among solar cells, the monocrystalline silicon solar cell has highest photoelectric conversion efficiency and very stable performance. There have been monocrystalline silicon solar cells with a photoelectric conversion efficiency of as high as 12-22% available in the market.

Monocrystalline silicon has an energy gap of 1.12 eV. Therefore, the monocrystalline silicon solar cell can only make use of the portion of sunlight having wavelengths shorter than 1100 nm. However, there is still a large portion of sunlight having wavelengths longer than 1100 nm. Therefore, how to extract more electric energy from sunlight has been the problem that the fields concerned desire to overcome. Besides, how to use reliable and low-cost processes to obtain materials of high photoelectric conversion efficiency is another problem of the fields concerned.

SUMMARY OF THE INVENTION

The primary objective of the present invention is to provide a simple, fast and reliable method to fabricate a photoelectric material and promote the solar cell technology.

To achieve the abovementioned objective, the present invention proposes a method for fabricating a P-type polycrystalline silicon-germanium structure, which comprises:

Step S1: sequentially forming an aluminum layer and an amorphous germanium layer on a P-type monocrystalline silicon substrate, wherein the aluminum layer is interposed between the P-type monocrystalline silicon substrate and the amorphous germanium layer;

Step S2: annealing the P-type monocrystalline silicon substrate, the aluminum layer and the amorphous germanium layer at a temperature of 400-650° C.; and Step S3: undertaking an aluminum-induced crystallization process in which the germanium atoms of the amorphous germanium layer and the silicon atoms of the P-type monocrystalline silicon substrate pass through the aluminum layer and then the amorphous germanium layer being induced and converted into a P-type polycrystalline silicon-germanium layer between the P-type monocrystalline silicon substrate and the aluminum layer.

The present invention is characterized in converting the amorphous germanium layer into a P-type polycrystalline silicon-germanium layer with an aluminum-induced crystallization process, which is a simple, reliable and low-cost technology. The obtained P-type polycrystalline silicon-germanium layer can convert sunlight of longer wavelengths into electric energy and thus can apply to fabricate a solar cell of high photoelectric conversion efficiency.

DETAILED DESCRIPTION OF THE PREFERRED EMBODIMENTS

The technical contents of the present invention are described in cooperation with drawings below.

Figure 1A:
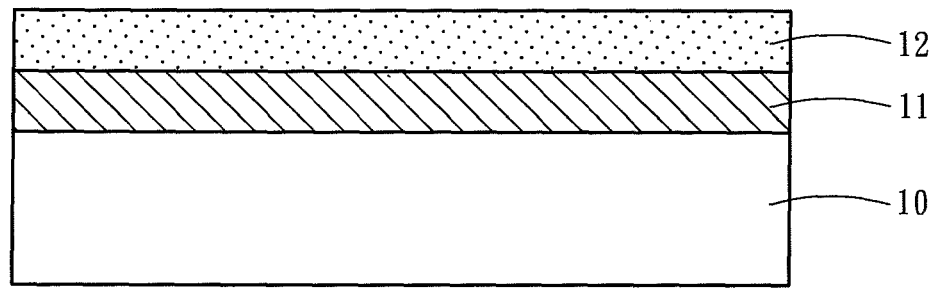
FIGS. 1A-1C schematically show the steps of a method for undertaking an aluminum-induced crystallization process according to one embodiment of the present invention.
Figure 1B:
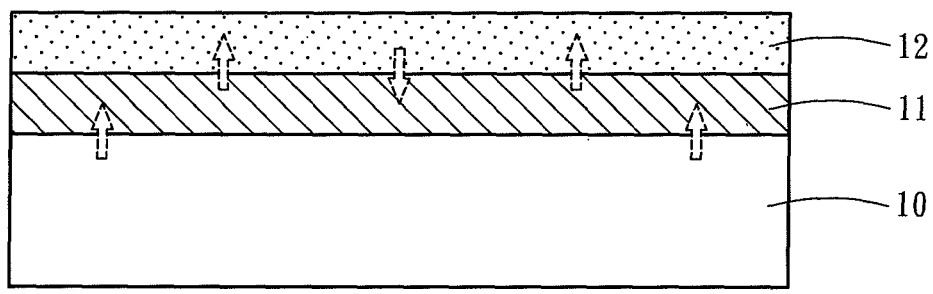
Figure 1C:
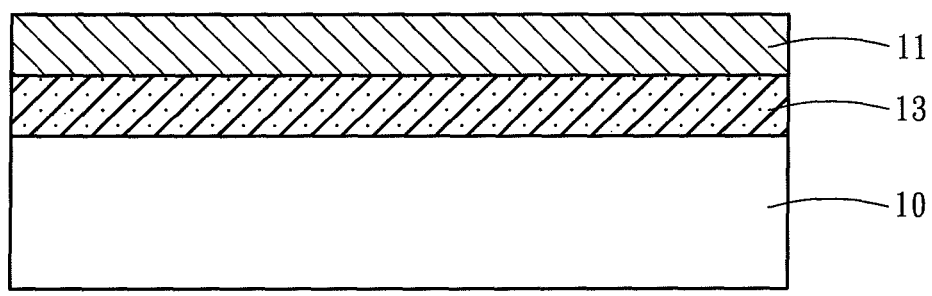

Refer to FIGS. 1A-1C. The method for fabricating a P-type polycrystalline silicon-germanium structure of the present invention comprises the following steps:

Step S0—flushing: Flush the surface of a P-type monocrystalline silicon substrate 10 to remove pollutants.

Step S1—deposition: Form an aluminum layer 11 and an amorphous germanium layer 12 on the P-type monocrystalline silicon substrate 10 in sequence. As shown in FIG. 1A, the aluminum layer 11 is interposed between the P-type monocrystalline silicon substrate 10 and the amorphous germanium layer 12. In one embodiment, the aluminum layer 11 and the amorphous germanium layer 12 are formed through a film deposition technology at a pressure of smaller than $1 \times 10^{-5}$ mbar. In one embodiment, each of the aluminum layer 11 and the amorphous germanium layer 12 has a thickness of 500 nm.

Step S2—annealing: Anneal the P-type monocrystalline silicon substrate 10, the aluminum layer 11 and the amorphous germanium layer 12 at a temperature of 400-650° C. for 0.5-6 hours.

Step S3—aluminum-induced crystallization: Undertake an aluminum-induced crystallization process in which the germanium atoms of the amorphous germanium layer 12 and the silicon atoms of the P-type monocrystalline silicon substrate 10 pass through the aluminum layer 11 (as shown in FIG. 1B), and then the amorphous germanium layer 12 is induced and converted into a P-type polycrystalline silicon-germanium layer 13 between the P-type monocrystalline silicon substrate 10 and the aluminum layer 11 (as shown in FIG. 1C).

The obtained P-type polycrystalline silicon-germanium layer 13 can convert sunlight of longer wavelengths into electric energy and thus can apply to fabricate a solar cell of high photoelectric conversion efficiency.

Figure 2:
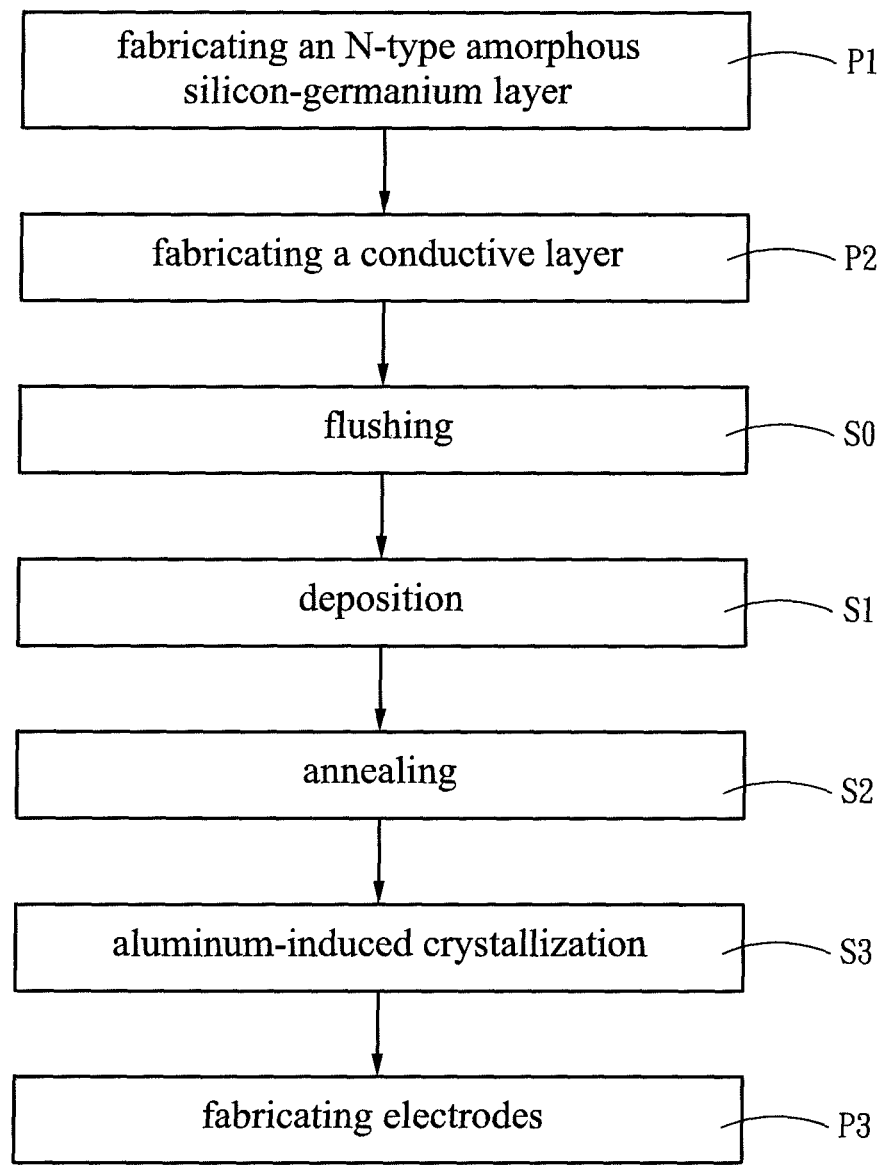
FIG. 2 shows a flowchart of a method for fabricating a solar cell containing a P-type polycrystalline silicon-germanium layer according to one embodiment of the present invention.
Figure 3A:
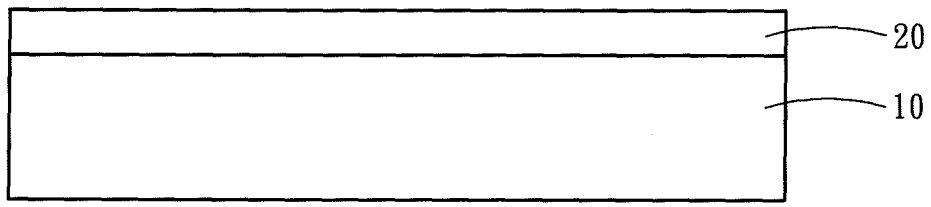
FIGS. 3A-3D schematically show the steps of a method for fabricating a solar cell containing a P-type polycrystalline silicon-germanium layer according to one embodiment of the present invention.

Refer to FIG. 2 showing a flowchart of a method for fabricating a solar cell containing a P-type polycrystalline silicon-germanium layer according to one embodiment of the present invention. The method for fabricating a solar cell of the present invention comprises the following procedures and Steps:

Procedure P1—fabricating an N-type amorphous silicon-germanium layer: Fabricate an N-type amorphous silicon-germanium layer 20 on a P-type monocrystalline silicon substrate 10, as shown in FIG. 3A. In one embodiment, the N-type amorphous silicon-germanium layer 20 is formed with a CVD (Chemical Vapor Deposition) method, a sputtering method, or an evaporation method. In one embodiment, the N-type amorphous silicon-germanium layer 20 has a thickness of 0.1-2 μm. The N-type amorphous silicon-germanium layer 20 has an energy gap value greater than that of common monocrystalline silicon and thus are used to extract energy of sunlight having shorter wavelengths (such as wavelengths shorter than 1100 nm).

Figure 3B:
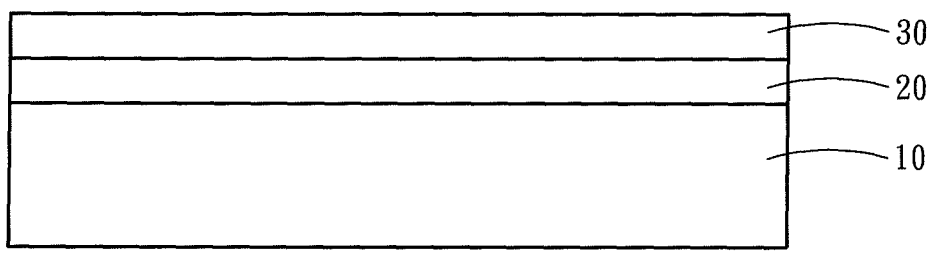

Procedure P2—fabricating a conductive layer: Form a transparent conductive layer 30 on one side of the N-type amorphous silicon-germanium layer 20, which is far away from the P-type monocrystalline silicon substrate 10, as shown in FIG. 3B. In one embodiment, the transparent conductive layer 30 is formed on the surface of the N-type amorphous silicon-germanium layer 20 which has been roughened during the procedure P2, and the transparent conductive layer 30 also can be roughened to reduce reflection of incident light.

Figure 3C:
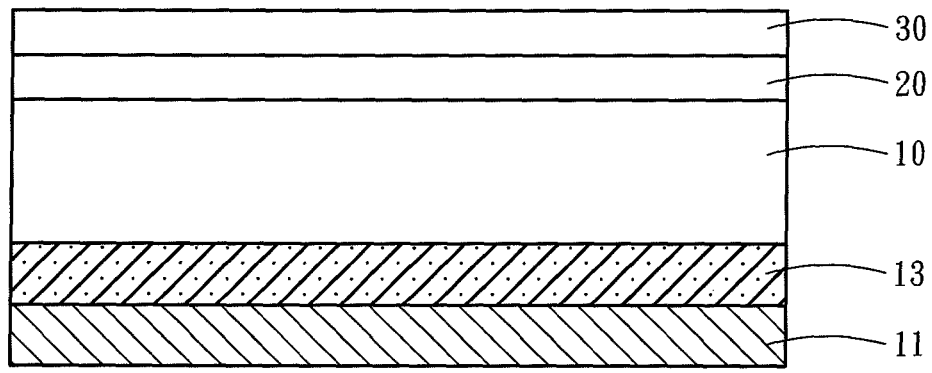

Steps S0-S3: After Procedure P1 and Procedure P2 have been completed, Steps S0-S3 are undertaken on the other side of the P-type monocrystalline silicon substrate 10, which is far away from the N-type amorphous silicon-germanium layer 20, to form the aluminum layer 11 and the P-type polycrystalline silicon-germanium layer 13 with the aluminum-induced crystallization technology, as shown in FIG. 3C.

Figure 3D:
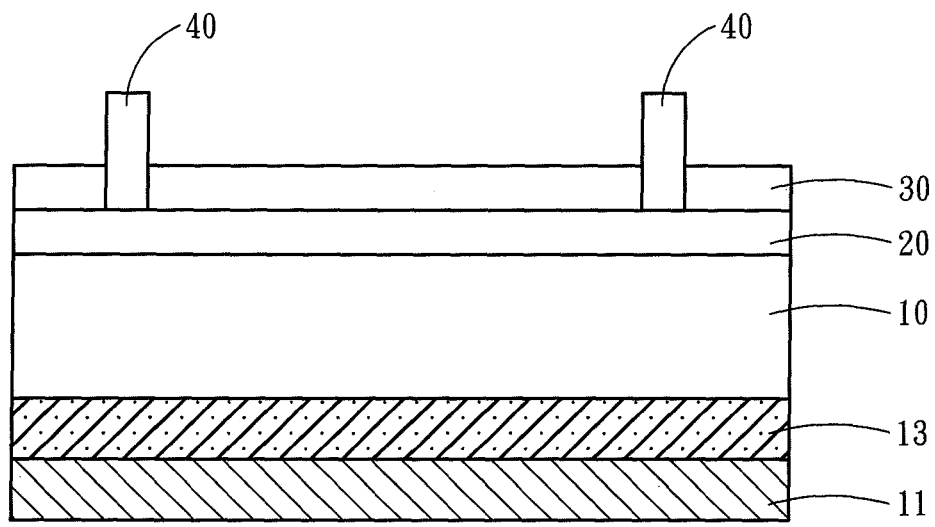

Procedure P3—fabricating electrodes: Fabricate metal electrodes 40 on the surface of the transparent conductive layer 30, as shown in FIG. 3D. In one embodiment, the metal electrodes 40 penetrate the transparent conductive layer 30 and connect with the N-type amorphous silicon-germanium layer 20. In one embodiment, the metal electrodes 40 have a finger-like form.

In conclusion, the invention has the following advantages:
1. The present invention uses the aluminum-induced crystallization process to convert the amorphous germanium layer into a P-type polycrystalline silicon-germanium layer. Therefore, the present invention has a simple, reliable and low-cost fabrication process.
2. The obtained P-type polycrystalline silicon-germanium layer can convert sunlight of longer wavelengths into electric energy. Therefore, the present invention can apply to fabricate a solar cell of high photoelectric conversion efficiency.
3. The aluminum layer is formed on the bottom of the solar cell through the aluminum-induced crystallization process and exempts the present invention from fabricating additional bottom electrodes. Therefore is further reduced the fabrication cost of the present invention.
4. The N-type amorphous silicon-germanium layer, the P-type monocrystalline silicon substrate, and the P-type polycrystalline silicon-germanium layer can respectively extract the energies of the light having shorter wavelengths, the visible light, and the light having longer wavelengths. Therefore, the present invention can fabricate a solar cell able to make use of the energy of light distributed in a wide range of the spectrum and having high photoelectric conversion efficiency.

Therefore, the present invention has utility, novelty and non-obviousness and meets the condition of a patent. Thus, the Inventors file the application for a patent. It is appreciated if the patent is approved fast.

The present invention has been described in detail with the embodiments. However, these embodiments are only to exemplify the present invention. They are not intended to limit the scope of the present invention. Any equivalent modification or variation according to the spirit of the present invention is to be also included within the scope of the present invention.

What is claimed is:

1. A method for fabricating a P-type polycrystalline silicon-germanium structure, comprising:
   Step S1: forming an aluminum layer and an amorphous germanium layer on a P-type monocrystalline silicon substrate in sequence, wherein the aluminum layer is interposed between the P-type monocrystalline silicon substrate and the amorphous germanium layer;
   Step S2: annealing the P-type monocrystalline silicon substrate, wherein the aluminum layer and the amorphous germanium layer undergo annealing at a temperature of 400-650° C.; and
   Step S3: undertaking an aluminum-induced crystallization process in which germanium atoms of the amorphous germanium layer and silicon atoms of the P-type monocrystalline silicon substrate simultaneously pass through the aluminum layer, then the amorphous germanium layer being induced and converted into a P-type polycrystalline silicon-germanium layer between the P-type monocrystalline silicon substrate and the aluminum layer.

2. The method for fabricating a P-type polycrystalline silicon-germanium structure according to claim 1 further comprising Step S0: flushing the P-type monocrystalline silicon substrate before Step S1.

3. The method for fabricating a P-type polycrystalline silicon-germanium structure according to claim 1, wherein the aluminum layer has a thickness of 500 nm in Step S1.

4. The method for fabricating a P-type polycrystalline silicon-germanium structure according to claim 1, wherein the amorphous germanium layer has a thickness of 500 nm in Step S1.

5. The method for fabricating a P-type polycrystalline silicon-germanium structure according to claim 1, wherein Step S1 is undertaken at a pressure of smaller than $1 \times 10^{-5}$ mbar.

6. The method for fabricating a P-type polycrystalline silicon-germanium structure according to claim 1, wherein the aluminum layer and the amorphous germanium layer are formed on the P-type monocrystalline silicon substrate through a film deposition technology in Step S1.

7. The method for fabricating a P-type polycrystalline silicon-germanium structure according to claim 1, wherein the annealing is undertaken for 0.5-6 hours in Step S2.

* * * * *